US006831575B2

(12) United States Patent
Wu et al.

(10) Patent No.: US 6,831,575 B2
(45) Date of Patent: Dec. 14, 2004

(54) WORD ALIGNED BITMAP COMPRESSION METHOD, DATA STRUCTURE, AND APPARATUS

(75) Inventors: Kesheng Wu, Fremont, CA (US); Arie Shoshani, Berkeley, CA (US); Ekow Otoo, Albany, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/701,655

(22) Filed: Nov. 4, 2003

(65) Prior Publication Data

US 2004/0090351 A1 May 13, 2004

Related U.S. Application Data

(60) Provisional application No. 60/484,382, filed on Jul. 1, 2003, and provisional application No. 60/423,810, filed on Nov. 4, 2002.

(51) Int. Cl.[7] ................................ H03M 7/00
(52) U.S. Cl. ................................ 341/50; 341/55; 341/95
(58) Field of Search ................................ 341/50, 55, 95

(56) References Cited

U.S. PATENT DOCUMENTS 5,363,098 A * 11/1994 Antoshenkov ............... 341/95
5,907,297 A * 5/1999 Cohen et al. ................ 341/95

* cited by examiner

*Primary Examiner*—Michael Tokar
*Assistant Examiner*—Khai M. Nguyen
(74) *Attorney, Agent, or Firm*—Joseph R. Milner

(57) ABSTRACT

The Word-Aligned Hybrid (WAH) bitmap compression method and data structure is a relatively efficient method for searching and performing logical, counting, and pattern location operations upon large datasets. The technique is comprised of a data structure and methods that are optimized for computational efficiency by using the WAH compression method, which typically takes advantage of the target computing system's native word length. WAH is particularly apropos to infrequently varying databases, including those found in the on-line analytical processing (OLAP) industry, due to the increased computational efficiency of the WAH compressed bitmap index. Some commercial database products already include some version of a bitmap index, which could possibly be replaced by the WAH bitmap compression techniques for potentially increased operation speed, as well as increased efficiencies in constructing compressed bitmaps. Combined together, this technique may be particularly useful for real-time business intelligence. Additional WAH applications may include scientific modeling, such as climate and combustion simulations, to minimize search time for analysis and subsequent data visualization.

15 Claims, 2 Drawing Sheets

UNCOMPRESSED BITMAP
100000000000000000000000000000000000000000000000000000000000
100001100110011111111111111111111111111111111111111111111111
111111000000000000000000000000000000000000000100000111
105
UNCOMPRESSED PARSED BITMAP (WORD LENGTH = 15)
100 0000 0000 0000—U1
000 0000 0000 0000—U2
000 0000 0000 0000—U3
000 0000 0000 0000—U4
100 0011 0011 0011—U5
111 1111 1111 1111—U6
111 1111 1111 1111—U7
111 1111 1111 1111—U8
111 1110 0000 0000—U9
000 0000 0000 0000—U10
000 0000 0000 0000—U11
100 0001 11—U12
COMPRESSED BITMAP (WORD LENGTH = 16)
0100 0000 0000 0000—C1
1000 0000 0000 0011—C2
0100 0011 0011 0011—C3
1100 0000 0000 0011—C4
0111 1110 0000 0000—C5
1000 0000 0000 0010—C6
ACTIVE WORD
131
1000 0011 1xxx xxxx
x = UNUSED BIT
132
ACTIVE WORD BIT LENGTH = 9
133
LITERAL / FILL BIT
121
(0=LITERAL 1= FILL)
LITERAL VALUE
124
0100 0000 0000 0000—E1
1000 0000 0000 0011—E2
FILL LENGTH = 3
123
FILL VALUE = 0/1
122
FILL BIT SET
DATA STRUCTURE
110
COMPRESSED BITMAP
120
ACTIVE WORD
130
ACTIVE WORD BIT LENGTH
140

WORD ALIGNED BITMAP COMPRESSION METHOD, DATA STRUCTURE, AND APPARATUS

CROSS REFERENCE TO RELATED APPLICATIONS

This patent claims benefit of priority to U.S. Provisional Patent Applications 60/423,810, entitled "Word Aligned Hybrid Bitmap Compression and Search Method" filed Nov. 4, 2002, and 60/484,382 of the same title filed Jul. 1, 2003.

STATEMENT REGARDING FEDERAL FUNDING

This invention was made with U.S. Government support under Contract Number DE-AC03-76SF00098 between the U.S. Department of Energy and The Regents of the University of California for the management and operation of the Lawrence Berkeley National Laboratory. The U.S. Government has certain rights in this invention.

REFERENCE TO A COMPUTER PROGRAM

Not applicable.

BACKGROUND OF THE INVENTION

1. Field of the Invention

The present invention pertains generally to a word aligned compression method for arbitrary length and content bitmaps, and more particularly to methods of logical operations on such word aligned compressed bitmaps.

2. Description of the Relevant Art

U.S. Pat. No. 5,363,098, incorporated herein by reference, discloses a method for compressing, decompressing, and logically manipulating arbitrary bitmaps. The method uses what has been found to be a relatively computationally expensive byte boundary compression (BBC) method that produces very good compression ratios. However, due to the byte boundaries used, the BBC method uses significantly more computational effort than a method based upon the compression method using word alignment strategies, as described below.

Many commercial and scientific applications need to search and otherwise query large amounts of data. When the data is modified infrequently, as is the case in general databases, image databases, statistical databases, data warehouses, and large datasets produced by scientific experiments and simulations (generally referred to as write once—read many datasets), one of the faster indexing strategies is the bitmap index. Bitmap indexing methods are frequently the most efficient scheme for ad hoc searches on large datasets, a type of operation common in on-line analytical processing (OLAP) and business intelligence systems.

To reduce the large sizes of bitmap indices, the bitmaps are compressed. However, general-purpose compression schemes are not efficient for database query operations because such operations on the compressed bitmaps are too slow. A number of specialized schemes have been devised to address the lack of speed issue; such as the Byte-aligned Bitmap Code (BBC mentioned above). BBC has generally been considered to be most efficient of all known compression methods.

The new bitmap compression technique described herein uses a bitmap compression data structure and associated computer programmed methods tailored to use the compressed data structure. The bitmap compression method described herein, called Word-Aligned Hybrid (WAH) bitmap compression, increases the execution speed of operations by utilizing the compressed bitmaps. To achieve this increased speed, a compression method has been designed to store data in a way that requires less central processor unit (CPU) effort to compress and decompress bitmaps. Inventor tests have shown that on specific real and synthetic data sets, on the average, the WAH method may be as much as ten times faster than the BBC compression scheme when performing logical operations between compressed bitmaps. The specific data sets were selected to represent a wide spectrum of scientific and industrial applications.

Bitmap indices have previously been generally regarded as efficient for low cardinality attributes, i.e., those attributes with only a small number of different distinct values. Analyses and tests conducted by the inventors have demonstrated that with WAH compression the bitmap indices may also be efficient for high cardinality attributes. Thus the compressed bitmap index may now be used effectively on many different attributes.

BRIEF SUMMARY OF THE INVENTION

This invention provides for a bitmap compression data structure located in a computer readable medium comprising: a) a compressed bitmap comprised of words that have a length of Word Length (WL) bits, wherein said compressed bitmap represents sequentially corresponding bits in an uncompressed bitmap; b) an activeWord; c) an activeWord bit length, nbits, comprising: i) a series of remainder bits, numbering less than WL minus two, stored in the activeWord, (1) the series of remainder bits forming a remainder after the uncompressed bitmap has been parsed into contiguous groupings of WL minus one bits, (2) the nbits in the activeWord represents the last contiguous grouping of nbits bits in the uncompressed bitmap; and d) each of the words of the compressed bitmap having a literal/fill bit, wherein: i) in each of the words having the literal/fill bit that represents a set state, the compressed bitmap word further comprises: (1) a fill bit value having a binary state, and (2) a fill length, wherein the compressed bitmap word represents a contiguous grouping of (fill length*(WL minus one)) bits having the fill bit value state in the corresponding uncompressed bitmap; ii) in each of the words having the literal/fill bit that represents a not set state, a literal word represents a contiguous grouping of WL minus one bits of the corresponding uncompressed bitmap.

In an alternative embodiment, the bitmap compression data structure described above may have said compressed bitmap represent either the literal or a binary complement of the literal uncompressed bitmap.

In another embodiment, the bitmap compression data structure described in the above paragraph may have said literal/fill bit, where: a) is comprised of one or more bits; b) whereby said literal/fill bit alternatively represents either the set state, or the not set state.

In another embodiment, the bitmap compression data structure described in the above paragraph may have: a) said literal word representing the contiguous grouping of WL minus one bits by either the literal, a binary complement of the literal uncompressed bitmap, or any isomorphic transformation.

In another embodiment, the bitmap compression data structure described in the above paragraph may have: a means for calculating, on a computer, the bitmap compression data structure of the corresponding uncompressed bitmap.

In another embodiment, this invention provides for a method of bitmap compression comprising: a) initializing a Word Length (WL), a compressed bitmap of WL bits, an activeWord, and an activeWord bit length; i) providing a literal/fill bit in each Word Length word of the compressed bitmap by: (1) if the literal/fill bit is set to indicate a literal value, then (a) setting in the remaining WL minus one bits a literal representation of an uncompressed bitmap; (2) if the literal/fill bit is set to indicate a fill value, then (a) setting, in a fill bit, a representation of the fill value, and (b) setting a plurality of the remaining WL minus two bits to contain a representation, k, of a number of fill values repeated k*(WL minus one) times in the uncompressed bitmap; and b) continuing compression until done.

In another embodiment, the method of Word Aligned Hybrid bitmap compression of the above paragraph may have said initializing step further comprising: a) setting the compressed bitmap to an empty state; b) setting the activeWord to an empty state; and c) setting the activeWord bit length to zero length.

In another embodiment, the method of bitmap compression of described in the above paragraph may have said continuing compression step further comprising: a) starting at the beginning of the uncompressed bitmap and the beginning of the compressed bitmap that results from compression; and b) looping until the uncompressed bitmap is entirely compressed, the looping step comprising: i) sequentially inputting the WL minus one bits of the uncompressed bitmap into the activeWord; (1) if the end of the uncompressed bitmap is reached at any bit, then (a) setting the activeWord bit length to the number of the uncompressed bitmap bits input; and (2) exiting; ii) if the first WL minus one bits of the activeWord are identical and a current word in the compressed bitmap has the literal/fill bit set to the fill value representing the bits of the activeWord, then; (1) incrementing the number of fills, k, in the current word by one; (2) setting the activeWord to an empty state; and (3) setting the activeWord bit length to zero length; iii) else; (1) appending a new word to the compressed bitmap, which becomes the current word; (2) setting the literal/fill bit of the current word to a representation of the literal state in the compressed bitmap; and (3) setting the literal value to a representation of the activeWord; (4) setting the activeWord to an empty state; and (5) setting the activeWord bit length to zero length.

In another embodiment, this invention provides for a method of logically operating on a plurality of Word Aligned Hybrid compressed bitmaps comprising: a) inputting a plurality of Word Aligned Hybrid compressed bitmaps having a same uncompressed bit length; b) means for logically operating on the plurality of Word Aligned Hybrid compressed bitmaps to create a resultant Word Aligned Hybrid compressed bitmap that is a function of a logical operator.

In another embodiment, this invention provides for a Word Aligned Hybrid compressed bitmaps logical operation apparatus comprising: a) a computer that performs the steps of the above paragraph.

In another embodiment, this invention provides for the method of logically operating on a plurality of Word Aligned Hybrid compressed bitmaps of the above paragraph, wherein said inputting step may further comprise: a) reading one or more of the plurality of Word Aligned Hybrid compressed bitmaps from a computer readable medium.

In another embodiment, this invention provides for the method of logically operating on a plurality of Word Aligned Hybrid compressed bitmaps of the above paragraph, further comprising: a) outputting the resultant Word Aligned Hybrid compressed bitmap to a computer readable medium.

In another embodiment, this invention provides the method of logically operating on one or more Word Aligned Hybrid compressed bitmaps of the above paragraph, wherein said logical operator is selected from the group of logical operations consisting of the unary operator NOT, and the binary operators AND, NAND, OR, XOR, AND_NOT, and OR_NOT.

In another embodiment, this invention provides for a computational method of operating on a Word Aligned Hybrid compressed bitmap to determine a number of instances of a bit pattern in the compressed bitmap, the method comprising: a) inputting a Word Aligned Hybrid compressed bitmap that corresponds to an uncompressed bitmap; b) inputting a bit pattern comprising one or more bits; c) means for examining the Word Aligned Hybrid compressed bitmap to create a count that is a number of instances the bit pattern occurs in the corresponding uncompressed bitmap.

In another embodiment, this invention provides for a computational method of operating on a Word Aligned Hybrid compressed bitmap to determine a set of positions of instances of a bit pattern in the compressed bitmap, the method comprising: a) inputting a Word Aligned Hybrid compressed bitmap that corresponds to an uncompressed bitmap; b) inputting a bit pattern comprising one or more bits; c) means for traversing the Word Aligned Hybrid compressed bitmap to create a set of positions that are where the bit pattern occurs in the corresponding uncompressed bitmap.

BRIEF DESCRIPTION OF THE SEVERAL VIEWS OF THE DRAWINGS

The invention will be more fully understood by reference to the following drawings, which are for illustrative purposes only.

DETAILED DESCRIPTION OF THE PREFERRED EMBODIMENT

Definitions

Figure 1:
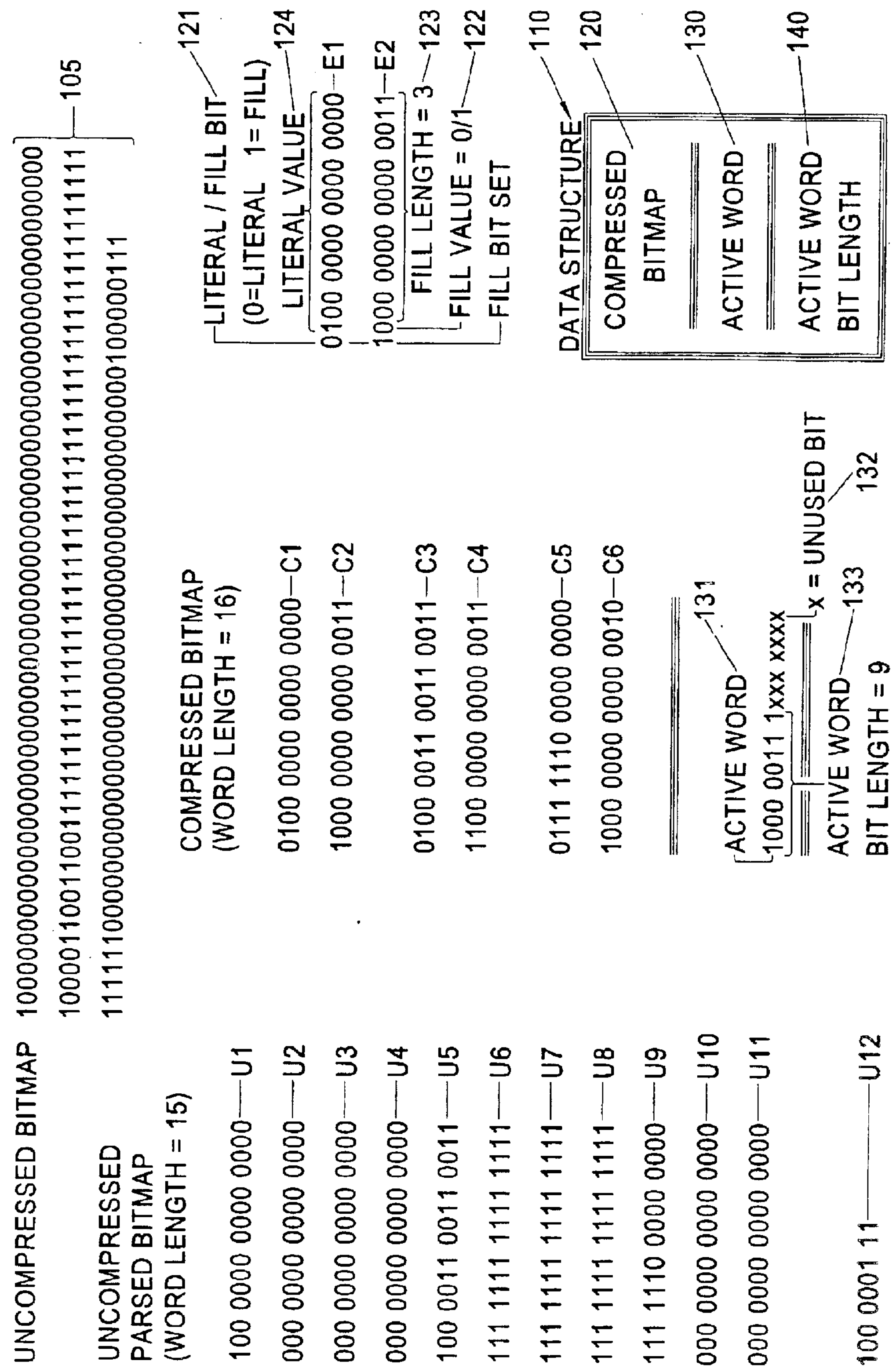
FIG. 1 is an example of an uncompressed bitmap at various stages of bitmap compression, indicating the compressed bitmap data structure, and the corresponding intermediate word structures.

"Bitmap" means an ordered sequence of bits.

"Computer" means any device capable of performing the methods, producing compressed bitmaps as described herein, or performing logical comparisons between a plurality of compressed bitmaps, and compressed and uncompressed bitmaps, as disclosed herein, including but not limited to: a microprocessor, a microcontroller, a digital state machine, a field programmable gate array (FGPA), a digital signal processor, a collocated integrated memory system with microprocessor and analog or digital output device, a distributed memory system with microprocessor and analog or digital output device connected by digital or analog signal protocols.

"Computer readable media" means any source of organized information that may be processed by a computer to perform the steps described herein to result in, store, perform logical operations upon, or transmit, a Word Aligned Hybrid compressed bitmap, including but not limited to: a magnetically readable storage system; optically readable storage media such as punch cards or printed matter readable by direct methods or methods of optical character recognition; other optical storage media such as a compact disc (CD), a digital versatile disc (DVD), a rewritable CD and/or DVD; electrically readable media such as programmable read only memories (PROMs), electrically erasable programmable read only memories (EEPROMs), field programmable gate arrays (FGPAs), flash random access memory (flash RAM); and remotely transmitted information by electromagnetic or optical methods including, but not limited to, wireless transmission, copper wires, and optical fibers.

"Literal/fill bit, or LFB" means one or more bits representing either of a literal or a fill state.

"MSB" means the most significant bit of a computer word of a specific computer system.

"Word Aligned Hybrid, or WAH" means a compressed bitmap as described herein.

"Word Length" means the most frequently operated upon number of bits in a computer word of a specific computer system.

The WAH Compression Method Overview

In the WAH compression method described herein, the basic storage unit is a computer word. Most present computational technology generally has word sizes that contain 32 bits. Word lengths are quickly moving to 64 and 128-bits. To simplify the description of the compression method herein, the 16 and 32-bit words are used in examples as indicated. However, the basic method can be easily applied to different size words, even down to 8 bit word lengths. In the description immediately below, a 32-bit word is used as an illustrative example.

Given an ordered sequence of bits (a bitmap), we first conceptually group (or parse) the bits into 31-bit groups. Each 31-bit group may contain all zeros, all ones, or a mixture of zeros and ones. If the 31-bit group contains a mixture of zeros and ones, it is stored literally (i.e. as-is) in a word, and a literal/fill bit (here the most significant bit, or MSB of the word) in the word is set to zero to indicate it is a literal word. Adjacent groups of zeros are combined with neighboring groups that are the also all zeros, with a fill bit of value 0, into a single compressed bitmap word entry represented as a count of the words. An analogous procedure is done for adjacent 31-bit groups that are all ones, with the fill bit of value 1. Each combined group is called a fill. Two parameters are needed to describe each fill, the bit value and the length of the fill. One word of Word Length is used to store each such fill. The literal/fill bit (again in this example the MSB) of the word is set to one (to distinguish it from a literal word), the second most significant bit is set to the bit value of the fill, and remaining 30 bits are used to store the number of the 31-bit groups. For fill lengths greater than fit into 30 bits, a maximum fill length word is stored, and the process continues.

When the last remaining grouping of 30 or fewer bits is reached, the remaining group is stored as a literal value. This final literal value is known as the active word. Another word containing the number of bits used in the active word allows for full decompression of the compressed bitmap.

If the last remaining grouping of bits is exactly 31 bits, the word may be stored alternatively either: 1) as an appended literal value, with the active word bit length set to zero, or 2) as the active word, and the active word bit length set to 30.

Depending on the hardware platform used for bitmap compression and/or comparison, this WAH compression method may work best with the literal/fill bit being the MSB of the compressed data word, and the fill value bit being located at the bit position adjacent to the MSB; however, these bit positions may be anywhere in the compressed word.

The WAH compression method works well for bitmaps with long sequences of zeros and/or long sequences of ones. Such is the case for non-random data, which is typical of many types of data.

An important concept for this compression method is the use of equal size bitmap groups regardless of their representations as literal words or fill words. Thus, logical operation algorithms do not require individual bit-by-bit comparisons of two compressed bit sequences when performing logical operations. This provides an advantage in performing logical operations over the bitmaps, as the word-aligned operations on compressed bitmaps tend to be very efficient. Using experimental test data sets, the WAH compression scheme has been found so efficient that query processing on the compressed bitmap indexes was, on average, more efficient than query processing on the uncompressed indexes, despite the computational overhead of having to interpret the content of the compressed words.

In this example and the example shown in FIG. 1 described below, the active word, literal/fill bit, fill value, fill length, literal value, and the list of regular words are represented by their original binary values. However, with possibly somewhat reduced computation efficiency, any one or more of the representations may be binary complements of the representations used above. The bits in the active word may occupy any positions, such as from MSB to the least significant bit, from least significant bit to MSB, or starting from an intermediate bit position. The word used to represent the number of bits in the active word may use any format including the normal binary integers. Additionally, the positional locations of the literal/fill bit, fill value, fill length, and literal value could be interchanged, or indeed split or positioned anywhere in the word so long as the data may be represented in the WAH format with no information loss.

WAH Data Structure

Refer now to FIG. 1. For clarity a computer word length of 16 bits has been used here to illustrate the compression of an uncompressed bitmap of 174 bits, shown here as 105. A data structure 110 is comprised of three elements: a compressed bitmap of regular WAH words 120, an active word 130, and an active word bit length 140.

Within each word of the compressed bitmap 120, there is a literal/fill bit (LFB) 121 indicating whether the individual compressed data word C1–C6 holds a number of literal bit values (here designated by a 0 bit), or a fill (here designated by a 1 bit). In this example, the MSB of each word of the compressed bitmap 120 is used to designate the literal/fill bit. If the literal/fill bit is set, as indicated in compressed bitmap word C2, there is an associated fill value 122, indicating the bit value of the fill. In the remaining bits of the word, a fill length 123 is placed. The fill length 123 is the number of parsed groupings (here 15 bits per parsed bitmap grouping) having fill value 122 corresponding to the uncompressed parsed bitmap.

If the literal/fill bit represents a literal word, the remaining (word length minus one) bits of the compressed bitmap word contain a literal representation of the next word length minus one bits of the uncompressed parsed bitmap.

Implementation of this method is more easily comprehended by use of an example.

Example of a Word-Aligned Hybrid Bitmap Compression Method

Refer again to FIG. 1. An initial sample uncompressed bitmap 105 of "1000000000000000000000000000000000 000000000000000000000000100001100110011 1111111111111111111111111111111111111111111111111 10000000000000000000000000000000000000010 0000111" is comprised of 174 consecutive bits. This initial uncompressed bitmap is conceptually sequenced through in groups of the output compressed bitmap word length minus one. For ease of understanding, the example uses a 16-bit compressed bitmap word length, common on older computer systems, and some microprocessors. This word length was chosen as an example for the sake of clarity, since 64 and 128 bit word lengths are extremely tedious to read in binary form.

The uncompressed bitmap is shown parsed into uncompressed parsed bitmap words U1–U12 having 15 bits, or the word length minus one. U12 is a remainder of the bitmap comprising an incomplete word having only 9 bits. In this example, the active word 131 is simply a literal value having the remaining 9 bits in the leftmost position, from bits {MSB . . . MSB-8}. The unused bits 132 are indicated as x's, and are not used. The active word bit length 133, contains the number of bits used in the active word 131; here the value is 9, as there are 9 bits in the active word bit length.

We begin with the first uncompressed parsed bitmap word U1. U1 is tested to see if all bits are 0's or all bits are 1's. If they are not, as in this case, then the corresponding compressed bitmap word C1 is a literal. The literal is formed with a 0 in the LFB position to indicate a literal word, and the remaining bits set to the bit values of U1. This is further detailed in example word E1, which is C1 depicting the literal/fill bit 121 location, and the literal value 124 filled with the contents of U1.

The next uncompressed parsed bitmap word U2 is examined. U2 is tested to see if all bits are 0's or all bits are 1's. Here, U2 is all zeros, so we have a fill with a fill value 122 of 0 (since U2 is also all zero), and a fill length of 1. If U2 is an isolated group of bits that are all the same state, it may be represented as a literal word to improve operational efficiency.

The next uncompressed parsed bitmap word U3 is examined. U3 is tested to see if all bits are 0's or all bits are 1's. Here, U3 is all zeros, so we have a fill with a fill value 122 of 0 (since U2 is all zero). Since the previous compressed bitmap word C2 was also a fill with a fill value of 0, so we increment the compressed bitmap word C2 to result in a fill length of 2.

The same process is performed with U4, and the compressed bitmap word C2 is incremented to have a binary fill length of $11_b$ (a 11 in binary notation), or $3_{10}$ (three in decimal notation), meaning that there are three fills of value 0 for word length minus one bits, or 3*15=45 bits of consecutive zeros.

The previous three uncompressed parsed bitmap words are thus stored in the compressed bitmap word C2. An alternative method would be to examine U2–U5 to determine that there are three groups of zeros are present. This is simply written with the literal/fill bit 121 set to a value of 1 to indicate a fill word, the fill value 122 set to a value of zero (since U2–U4 are all zeros), and a fill length 123 of $11_b$, or $3_{10}$. The resultant example fill word is shown in E2, which is identical to C2.

At U5, we find another literal value, so a literal compressed bitmap word C3 is formed, with the literal/fill bit 121 set as 0, a literal, and the remaining 15 bits filled with the literal values of U5.

U6–U8 form a fill of three uncompressed parsed word groupings, so the literal/fill bit 121 is set to a 1 to indicate a fill, the fill value 122 is set to a 1 to indicate that the fill will be made up of 1's, and a fill length 123 of length binary 11, or decimal 3. This represents 3*15=45 consecutive bits having a value of 1 (the fill value).

U9 is compressed into a corresponding literal value C5 as described previously.

U10–U11 are compressed into a fill with a fill length 123 of binary 10, or decimal 2, with a fill value 122 of 0.

The remaining 9 bits of the initial uncompressed bitmap do not fit evenly into a parse length of 15 bits, so they are placed into the active word 131, and the active word bit length set to the remaining bit length, 9 bits.

This example has shown an explicit uncompressed parsed bitmap. In practical application, the parsing need only be done one grouping at a time. The method can be compiled onto a variety of computers having widely variant computer word lengths. By suitable adaptation, the method can be parallelized to be run even faster on multiple CPU parallel platforms. An initial method of parallelization would be for each CPU to compress a segment of the uncompressed bitmap, and then combining the compressed segments into an overall compress bitmap of the entire uncompressed bitmap.

Operations with the Word-Aligned Hybrid Bitmap Compression Method

The Word-Aligned Hybrid Bitmap Compression Method can readily be programmed for arbitrary bitmap logical operations. Due to the simplicity of the compression data structure, bitmap logical operations have been found to generally be faster than with other compression methods. Applications of bitmap index in database systems are described elsewhere, but in their simplest forms two compressed bitmaps are constructed and/or read from another data source, and then logically compared using operators including, but not limited to: "AND", "OR", "XOR", "AND_NOT", "OR_NOT", and others. The two compressed bitmaps are then sequentially operated upon to determine the logical result.

Range queries may be conducted by compound basic logical operations over compressed bitmaps, such as "0<=A<6" can usually be efficiently answered when the attribute A is indexed with a bitmap index. Many operations on data sets, such as computing or estimating sums and averages, can also be efficiently carried out using logical operations on WAH compressed bitmaps from the bitmap indices.

Comparing two large bitmaps is an useful operation in many applications. It may be more efficiently carried out by using bitwise logical operations on WAH compressed bitmaps.

In many applications, it is often necessary to extract a list of bit positions of a specific bit pattern from a bitmap. This operation can be readily performed on WAH compressed bitmaps.

Counting of a number of instances of a particular bit pattern of one or more bits in a compressed bitmap, may be readily achieved by examining (which is typically traversing, but may be otherwise implemented) the WAH compressed bitmap. In many cases, performing this counting on WAH compressed bitmaps is more efficient than on uncompressed bitmaps or on compressed bitmaps produced with other compression methods.

Using the WAH compression techniques, one or more WAH compressed bitmap may be simultaneously constructed directly from input data (which may be real-time, or archived) without requiring the data records to be sorted or uncompressed bitmaps be produced. This reduces the time needed to construct an index. Since bitmaps do not generally require records to be in any specific order, the records may be ordered to speed up other data manipulation operations unrelated to the WAH compressed bitmaps.

Figure 2:
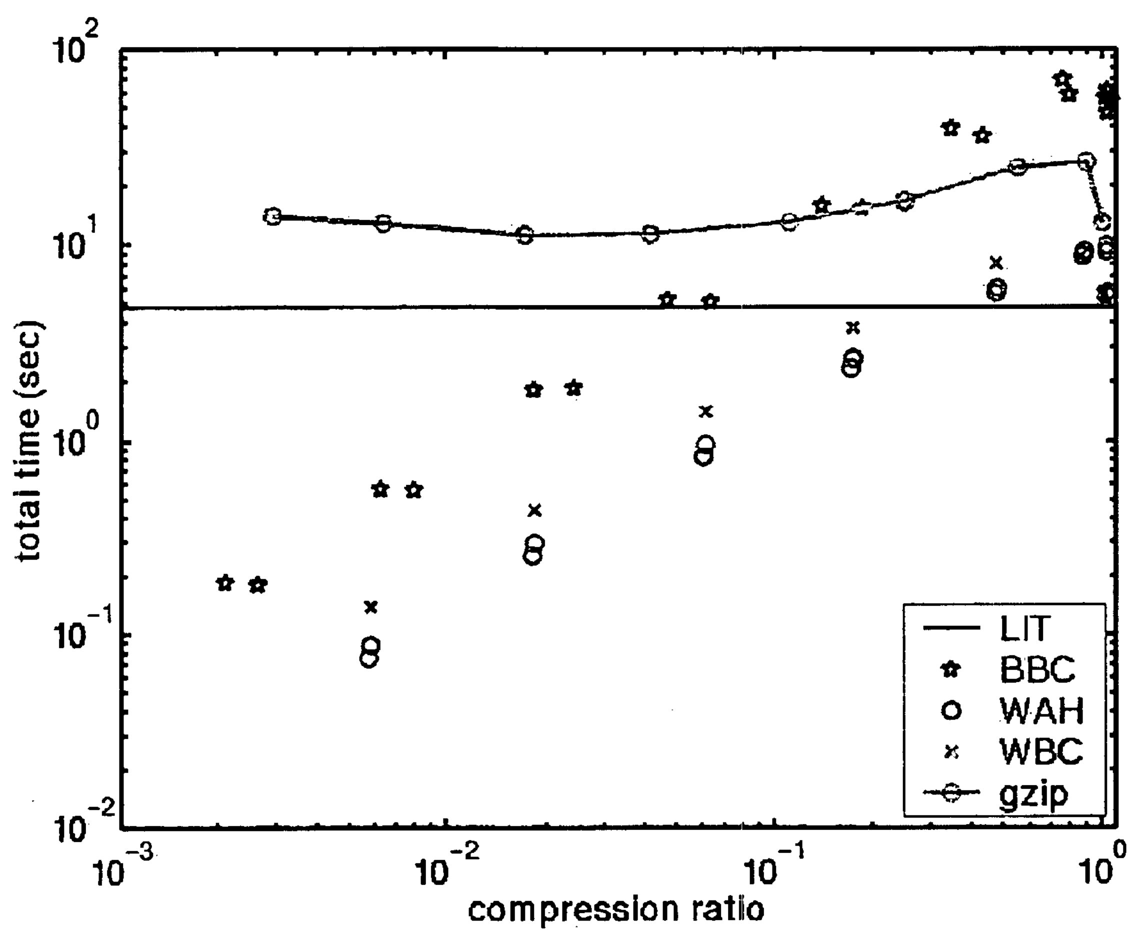
FIG. 2 is a graph of compression ratio versus total time for logical operations among each of four specific sample compressed data sets and their corresponding literal values.

FIG. 2 indicates the performance of the WAH method relative to other compression methods. Here, we have a logical operation between two data sets. The value "LIT" represents the uncompressed literal data. "BBC" represents the Byte-aligned Bitmap Code mentioned above. Comparisons of the WAH and BBC were found to be so disparate in performance, that the BBC method was reprogrammed for word alignment for a sizeable speed improvement in the data trace WBC, or Word-aligned Bitmap Code. "gzip" the last data trace, represents another compression method that achieves high compression, but exceedingly poor logical comparison speed characteristics.

FIG. 2 has a vertical axis of computational time required to perform a logical operation between two sample bitmap data sets. In each of the two closely-spaced data points, logical operations were performed between random data (typically the data point taking more time, and more space), and stochastically related data representative of scientific data where there is significant "lumping" or "clustering" of data. It can be seen that the WAH method typically exceeds performance of the BBC method by a significant amount. The horizontal axis is the compression ratio of the compressed bitmaps, where the compression ratio is defined to be the ratio of compressed bitmap size in bits, to the corresponding uncompressed bitmap. In most test cases, WAH logical operations are as fast as or faster than the same operations on the literal, uncompressed data.

Applications of the Word-Aligned Hybrid Bitmap Compression Method

Knowledgeable computer scientists can code the Word-Aligned Hybrid data structure, logical operation methods, and bitmap compression methods, to operate over distributed networked computer systems, or other types of networked computers and computer readable media systems. Typical implementations could involve answering queries from distributed users at distributed query servers using still other remote data warehouses having WAH compressed bitmaps.

The compressed bitmap data structure may be transmitted over various networking systems including wireless, optical, electromagnetic. The computer programmed methods used for compression, counting, pattern position location, and bitmap operations, maybe stored on computers, and computer readable media. The compressed bitmap methods may be transmitted over any network to operate on remote data, some or all of the data required for the various bitmap operations may be read from compressed bitmaps on any remote or attached computer readable media. Additionally, the result produced by the various bitmap operations may be transmitted over any distributed or non-distributed system, and written or otherwise recorded in any remote or attached computer readable media.

All publications, patents, and patent applications mentioned in this application are herein incorporated by reference to the same extent as if each individual publication or patent application were each specifically and individually indicated to be incorporated by reference.

The description given here, and best modes of operation of the invention, are not intended to limit the scope of the invention. Many modifications, alternative constructions, and equivalents may be employed without departing from the scope and spirit of the invention.

We claim:

1. A bitmap compression data structure located in a computer readable medium comprising:

a) a compressed bitmap comprised of words that have a length of Word Length (WL) bits, wherein said compressed bitmap represents sequentially corresponding bits in an uncompressed bitmap;

b) an activeWord;

c) an activeWord bit length, nbits, comprising:

i) a series of remainder bits, numbering less than WL minus two, stored in the activeWord, (1) the series of remainder bits forming a remainder after the uncompressed bitmap has been parsed into contiguous groupings of WL minus one bits, (2) the nbits in the activeWord represents the last contiguous grouping of nbits bits in the uncompressed bitmap; and d) each of the words of the compressed bitmap having a literal/fill bit, wherein:

i) in each of the words having the literal/fill bit that represents a set state, the compressed bitmap word further comprises:

(1) a fill bit value having a binary state, and (2) a fill length, wherein the compressed bitmap word represents a contiguous grouping of (fill length * (WL minus one)) bits having the fill bit value state in the corresponding uncompressed bitmap;

ii) in each of the words having the literal/fill bit that represents a not set state, a literal word represents a contiguous grouping of WL minus one bits of the corresponding uncompressed bitmap.

2. The bitmap compression data structure of claim 1 wherein said compressed bitmap represents either the literal or a binary complement of the literal uncompressed bitmap.

3. The bitmap compression data structure of claim 1 wherein said literal/fill bit a) is comprised of one or more bits;

b) whereby said literal/fill bit alternatively represents either the set state, or the not set state.

4. The bitmap compression data structure of claim 1 wherein:

a) said literal word represents the contiguous grouping of WL minus one bits by either the literal, a binary complement of the literal uncompressed bitmap, or any isomorphic transformation.

5. A method for forming the bitmap compression data structure of claim 1 comprising:

a) means for calculating, on a computer, the bitmap compression data structure of the corresponding uncompressed bitmap.

6. A method of bitmap compression comprising:

a) initializing a Word Length (WL), a compressed bitmap of WL bits, an activeWord, and an activeWord bit length;

i) providing a literal/fill bit in each Word Length word of the compressed bitmap by:

(1) if the literal/fill bit is set to indicate a literal value, then (a) setting in the remaining WL minus one bits a literal representation of an uncompressed bitmap;

(2) if the literal/fill bit is set to indicate a fill value, then (a) setting, in a fill bit, a representation of the fill value, and (b) setting a plurality of the remaining WL minus two bits to contain a representation, k, of a number of fill values repeated k*(WL minus one) times in the uncompressed bitmap; and b) continuing compression until done.

7. The method of bitmap compression of claim 6 wherein said initializing step further comprises:

a) setting the compressed bitmap to an empty state;

b) setting the activeWord to an empty state; and c) setting the activeWord bit length to zero length.

8. The method of bitmap compression of claim 6 wherein said continuing compression step further comprises:

a) starting at the beginning of the uncompressed bitmap and the beginning of the compressed bitmap that results from compression; and b) looping until the uncompressed bitmap is entirely compressed, the looping step comprising:

i) sequentially inputting the WL minus one bits of the uncompressed bitmap into the activeWord;

(1) if the end of the uncompressed bitmap is reached at any bit, then (a) setting the activeWord bit length to the number of the uncompressed bitmap bits input; and (2) exiting;

ii) if the first WL minus one bits of the activeWord are identical and a current word in the compressed bitmap has the literal/fill bit set to the fill value representing the bits of the activeWord, then;

(1) incrementing the number of fills, k, in the current word by one;

(2) setting the activeWord to an empty state; and (3) setting the activeWord bit length to zero length;

iii) else;

(1) appending a new word to the compressed bitmap, which becomes the current word;

(2) setting the literal/fill bit of the current word to a representation of the literal state in the compressed bitmap; and (3) setting the literal value to a representation of the activeWord;

(4) setting the activeWord to an empty state; and (5) setting the activeWord bit length to zero length.

9. A method of logically operating on a plurality of Word Aligned Hybrid compressed bitmaps comprising:

a) inputting a plurality of Word Aligned Hybrid compressed bitmaps having a same uncompressed bit length;

b) means for logically operating on the plurality of Word Aligned Hybrid compressed bitmaps to create a resultant Word Aligned Hybrid compressed bitmap that is a function of a logical operator.

10. A Word Aligned Hybrid compressed bitmaps logical operation apparatus comprising:

a) a computer that performs the steps of claim 9.

11. The method of logically operating on a plurality of Word Aligned Hybrid compressed bitmaps of claim 9, wherein said inputting step further comprises:

a) reading one or more of the plurality of Word Aligned Hybrid compressed bitmaps from a computer readable medium.

12. The method of logically operating on a plurality of Word Aligned Hybrid compressed bitmaps of claim 9, further comprising:

a) outputting the resultant Word Aligned Hybrid compressed bitmap to a computer readable medium.

13. The method of logically operating on one or more Word Aligned Hybrid compressed bitmaps of claim 9, wherein said logical operator is selected from the group of logical operations consisting of the unary operator NOT, and the binary operators AND, NAND, OR, XOR, AND_NOT, and OR_NOT.

14. A computational method of operating on a Word Aligned Hybrid compressed bitmap to determine a number of instances of a bit pattern in the compressed bitmap, the method comprising:

a) inputting a Word Aligned Hybrid compressed bitmap that corresponds to an uncompressed bitmap;

b) inputting a bit pattern comprising one or more bits;

c) means for examining the Word Aligned Hybrid compressed bitmap to create a count that is a number of instances the bit pattern occurs in the corresponding uncompressed bitmap.

15. A computational method of operating on a Word Aligned Hybrid compressed bitmap to determine a set of positions of instances of a bit pattern in the compressed bitmap, the method comprising:

a) inputting a Word Aligned Hybrid compressed bitmap that corresponds to an uncompressed bitmap;

b) inputting a bit pattern comprising one or more bits;

c) means for traversing the Word Aligned Hybrid compressed bitmap to create a set of positions that are where the bit pattern occurs in the corresponding uncompressed bitmap.

* * * * *